United States Patent
Takashima et al.

(10) Patent No.: US 6,200,947 B1
(45) Date of Patent: Mar. 13, 2001

(54) METAL-CORROSION INHIBITOR AND CLEANING LIQUID

(75) Inventors: Masayuki Takashima, Sodegaura; Kenichi Sawara, Ibaraki, both of (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/484,217

(22) Filed: Jan. 18, 2000

(30) Foreign Application Priority Data

Jan. 20, 1999 (JP) .................................................. 11-011740

(51) Int. Cl.$^7$ ................................ C11D 9/04; C11D 9/20; C03C 23/00; C23G 1/00; C23G 1/02
(52) U.S. Cl. ......................... 510/402; 510/175; 510/176; 134/2; 134/3
(58) Field of Search .................... 510/402, 175, 510/176; 134/2, 3

(56) References Cited

U.S. PATENT DOCUMENTS 5,308,745 * 5/1994 Schwartzkopf ...................... 430/329
5,648,324 * 7/1997 Honda et al. ........................ 510/176
5,665,688 * 9/1997 Honda et al. ........................ 510/178

FOREIGN PATENT DOCUMENTS

| 51-059041 | 5/1976 | (JP) . |
| 52-155148 | 12/1977 | (JP) . |
| 2-305982 | 12/1990 | (JP) . |

* cited by examiner

Primary Examiner—Yogendra Gupta
Assistant Examiner—John M. Petruncio
(74) Attorney, Agent, or Firm—Birch, Stewart, Kolasch & Birch, LLP

(57) ABSTRACT

There are provided a metal-corrosion inhibitor and a cleaning liquid comprising said corrosion inhibitor, which are suitable for cleaning semiconductor devices, and less than that so far in use in the possibility of affecting human health and the ecological system through a water medium, the corrosion inhibitor comprising an aliphatic alcohol compound having at least one mercapto group in the molecule, wherein a number of carbon atoms constituting said alcohol compound is not less than 2, and a carbon atom bonded with a mercato group and another carbon atom bonded with a hydroxyl group are contiguously bonded with each other.

8 Claims, No Drawings

METAL-CORROSION INHIBITOR AND CLEANING LIQUID

FIELD OF THE INVENTION

The present invention relates to a metal-corrosion inhibitor and a cleaning liquid. More specifically, the present invention relates to a metal-corrosion inhibitor and a cleaning liquid, which are useful for cleaning materials such as semiconductor devices.

BACKGROUND OF THE INVENTION

In a conventional wiring formation for semiconductor devices, it is general that a metal to be formed into a wiring is applied on a silicon wafer to form a film thereof, and the film is shaped into a desired wiring through lithography and dry etching, and thereafter spaces between the wiring are buried with an insulation film to perform the wiring formation. Recently, there has been developed a chemical mechanical polishing with use of both a special polishing agent and a polishing pad, which is hereinafter abbreviated as CMP, as the case may be, and a wiring formation by damascene process utilizing CMP has been paid attention. According to this method, an insulation film is formed first of all, and thereafter, a groove for the wiring is formed through lithography and dry etching, a metal is applied thereto to form a film thereof and bury the groove therewith, and then CMP is carried out to remove the metal film jutted out from the groove.

However, in the metal wiring formation utilizing CMP, both the surface and the back of a wafer are markedly contaminated with the polishing agent remaining after the metal polishing, a polishing scrap produced by the polishing and metal impurities contained in the polishing agent and the polishing pad, and therefore it is inevitable to clean the surface thereof after the polishing.

In general, in order to remove particles present on a wafer surface, it is desired to carrying out a cleaning with an alkaline solution, because it is important to inhibit re-adhesion of particles once removed out of the surface thereof. While, in order to remove metal impurities effectively, it is desired to carry out the cleaning with an acid solution having a strong metal dissolution power.

However, as is known, a metal is subject to corrosion with these alkaline and acid solutions. Therefore, in the case where the wafer surface on which the metal wiring lays bare is cleaned with these solutions, there is usually caused a problem such that the metal surface after the cleaning is subjected to corrosion, thereby causing increase of a wiring resistance and moreover a breaking down of the wiring.

As a corrosion inhibitor to avoid the metal-corrosion, there are known aromatic hydrocarbon compounds such as, for example, benzotriazole and 5-methylbenzimidazole, and an attempt to use these corrosion inhibitors has been made. Meanwhile, an influence upon human health and the ecological system suffered by various chemical substances discharged to surroundings is now examined. Thus, a metal-corrosion inhibitor less than that so far in use in the possibility of affecting human health and the ecological system through a water medium is desired to be developed.

SUMMARY OF THE INVENTION

The present inventors have undertaken extensive studies to find a metal-corrosion inhibitor freed from the aforementioned problem. As a result, it has been found that a compound having a carbon atom bonded with a mercapto group and another carbon atom bonded with a hydroxyl group, which are contiguously bonded with each other, is possessed of no metal-corrosion activity, and suitable for cleaning materials such as semiconductor devices, and moreover less than that so far in use in the possibility of affecting human health and the ecological system through a water medium, and thereby the present invention has been completed.

The present invention provides a metal-corrosion inhibitor comprising an aliphatic alcohol compound having at least one mercapto group in the molecule, wherein a number of carbon atoms constituting said alcohol compound is not less than 2, and a carbon atom bonded with a mercato group and another carbon atom bonded with a hydroxyl group are contiguously bonded with each other.

The present invention further provides a cleaning liquid comprising the aforementioned metal-corrosion inhibitor.

The present invention furthermore provides a process for cleaning semiconductor devices, which comprises contacting said devices with the aforementioned cleaning liquid.

DETAILED DESCRIPTION OF THE PREFERRED EMBODIMENT

The corrosion inhibitor in accordance with the present invention comprises an aliphatic alcohol compound having at least one mercapto group in the molecule. It is essential for the aliphatic alcohol that a number of carbon atoms is not less than 2, and a carbon atom bonded with a mercapto group and another carbon atom bonded with a hydroxyl group are contiguously bonded with each other, in other words, both the carbon atoms are directly bonded with each other, thereby obtaining a desired corrosion inhibiting effect. Preferred examples of the aliphatic alcohol compound are 2-mercaptoethanol and thioglycerol.

The corrosion inhibitor in accordance with the present invention can inhibit metal-corrosion. Said metal includes, for example, copper and copper alloys.

The corrosion inhibitor in accordance with the present invention can be incorporated into a cleaning liquid to provide a cleaning liquid having no corrosion. activity. As the cleaning liquid, those used for cleaning semiconductor devices are enumerated. Particularly when the cleaning liquid having no corrosion activity is used for cleaning semiconductor devices having a copper wiring, the characteristic features of the present invention can be exhibited. The cleaning liquid can be used in any form of an alkaline solution or an acid solution.

A concentration of the corrosion inhibitor in the cleaning liquid is preferably from about 0.0001 to about 10% by weight, more preferably from about 0.001 to about 1% by weight. When the concentration is too low, the corrosion inhibiting effect may be limited to an unsatisfactory degree. Whereas, too high concentration may not always give a further increased corrosion inhibiting effect and moreover may make difficult to handle it due to the odor peculiar to mercapto group-carrying compounds.

The cleaning liquid can be prepared easily by incorporating the corrosion inhibitor in accordance with the present invention into a conventional cleaning liquid and stirring the mixture to dissolve the corrosion inhibitor therein.

A cleaning with use of the cleaning liquid in accordance with the present invention is not particularly limited, and can be carried out in a conventional manner.

As the cleaning liquid to be incorporated with the aforementioned corrosion inhibitor, it is recommended to use an alkaline solution which is effective for removing fine particles present on a wafer with detrimental effect of causing copper wiring-corrosion easily, and an acid solution which is effective for removing metal impurities on a wafer with detrimental effect of causing copper wiring-corrosion easily.

The alkaline solution is not particularly limited, and includes, for example, aqueous solutions of inorganic compounds such as sodium hydroxide, potassium hydroxide and ammonium hydroxide, and aqueous solution of organic compounds such as tetramethylammonium hydroxide and choline. Particularly, it is recommended to use aqueous solutions of compounds such as ammonium hydroxide, tetramethylammonium hydroxide and choline, which have been purified to remove the metal impurities and fine particles.

The acid solution is not particularly limited, and includes, for example, aqueous solution of inorganic acids such as hydrochloric acid, hydrofluoric acid, sulfuric acid and nitric acid, and aqueous solution of organic acids such as oxalic acid, citric acid, malonic acid, malic acid, fumaric acid and maleic acid. Particularly, it is recommended to use aqueous solutions of acids such as hydrochloric acid, hydrofluoric acid, sulfuric acid, nitric acid, oxalic acid and citric acid, which have been purified to remove the metal impurities and fine particles.

A concentration of the alkaline solution or acid solution is preferably from 0.001% to 10% by weight, more preferably from 0.01% to 5% by weight. When the concentration is too low, washing effect may not be obtained sufficiently. When the concentration is too high, metal-corrosion of washing apparatus or the other related apparatus may be occurred.

The alkaline and acid solutions incorporated with the corrosion inhibitor may be used as they are, or may be incorporated with other effective liquids in a manner such that the effects of the corrosion inhibitor are not injured. Particularly, said solutions may be used effectively in combination with liquids such as aqueous hydrogen peroxide solution and aqueous ammonium fluoride solution purified for the purpose of semiconductor devices.

In carrying out the cleaning of a wafer with use of the cleaning liquid incorporated with the aforementioned corrosion inhibitor, there can be applied a dip-cleaning method wherein a wafer is directly dipped in the cleaning liquid, a method comprising combination of the dip-cleaning method with ultrasonic wave irradiation, a brush-cleaning method wherein a wafer is brushed, while spraying the cleaning liquid upon the surface thereof, and a method comprising combination of the brush-cleaning with ultrasonic wave irradiation. At the time of cleaning, the cleaning liquid can be heated.

According to the present invention, there can be provided a metal-corrosion inhibitor less than that so far in use in the possibility of affecting human health and the ecological system through a water medium, and a cleaning liquid comprising said corrosion inhibitor as an essential component, which is suitably used for cleaning materials such as semiconductor devices.

EXAMPLE

The present invention is illustrated in more detail with reference to the following Examples; which are not to be construed as limiting the scope of the present invention.

Examples 1 and 2 and Comparative Examples 1 to 5

The corrosion inhibitors in accordance with the present invention in each pre-determined amount as shown in Table 1 were incorporated into a 0.1% by weight aqueous ammonia solution as a cleaning liquid, thereby preparing respective corrosion inhibiting effect-carrying cleaning liquids in accordance with the present invention. For the purpose of comparison, prepared were the cleaning liquid without incorporation with any of corrosion inhibitors, cleaning liquids incorporated with compounds similar to the corrosion inhibitors of the present invention from a viewpoint of chemical structure, and a cleaning liquid incorporated with benzotriazol as the aromatic hydrocarbon corrosion inhibitor. As a test piece, a silicon wafer having a Cu film of 10000 Å in film thickness thereon formed by a sputtering method, was dipped respectively in these cleaning liquids for 30 minutes. The film thickness of Cu film was measured before and after the dipping, and a dissolution rate was calculated from the difference of the film thickness to judge a corrosion inhibiting effect. On the other hand, the surface of Cu film was observed with an electron microscope before and after the dipping to determine the state of Cu film surface. In measuring the film thickness, a sheet resistibility measuring apparatus manufactured by Napson.Co. was used for determining a sheet resistibility, which was then converted into the film thickness.

The results are summarized in Table 1. Table 1 demonstrates that the corrosion inhibitors in accordance with the present invention are remarkably effective for inhibiting conner-corrosion in alkaline solution. and less than that so far in use in the possibility of affecting human health and the ecological system through a water medium, because they are not aromatic compounds like benzotriazol.

Examples 3 and 4 and Comparative Examples 6 and 7

The corrosion inhibitor in accordance with the present invention in a pre-determined amount as shown in Table 2 was incorporated into a 0.1% by weight aqueous hydrofluoric acid solution or a 1% by weight aqueous hydrochloric acid solution, respectively, as cleaning liquids, thereby preparing respective corrosion inhibiting effect-carrying cleaning liquids in accordance with the present invention. For the purpose of comparison, said cleaning liquids without incorporation with any corrosion inhibitor were prepared. As a test piece, a silicon wafer having a Cu film of 10000 Å in film thickness thereon formed by a sputtering method, was dipped respectively in these cleaning liquids for 30 minutes. The film thickness of Cu film was measured before and after the dipping, and a dissolution rate was calculated from the difference of the film thickness to judge a corrosion inhibiting effect. On the other hand, the surface of Cu film was observed with an electron microscope before and after the dipping to determine the state of Cu film surface. The results are summarized in Table 2. Table 2 demonstrates that the corrosion inhibitor in accordance with the present invention is remarkably effective for inhibiting copper-corrosion in an acid solution.

TABLE 1

|  | Example | | Comparative Example | | | | |
| --- | --- | --- | --- | --- | --- | --- | --- |
|  | 1 | 2 | 1 | 2 | 3 | 4 | 5 |
| Corrosion inhibitor | | | | | | | |
| Kind | *1 | *2 | — | *3 | *4 | *5 | *6 |
| Concentration (wt %) | 0.05 | 0.05 | 0 | 0.05 | 0.05 | 0.01 | 0.05 |
| Evaluation results | | | | | | | |
| Dissolution rate (Å/min) | 5 | 5 | 13 | 13 | 12 | 5 | 71 |
| State of surface | ○ | ○ | X | X | X | ○ | X |

TABLE 2

|  | Example 3 | Comparative Example 6 | Example 4 | Comparative Example 7 |
| --- | --- | --- | --- | --- |
| Cleaning liquid | *7 | *7 | *8 | *8 |
| Corrosion inhibitor | | | | |
| Kind | *1 | — | *1 | — |
| Concentration (wt %) | 0.05 | 0 | 0.05 | 0 |
| Evaluation results | | | | |
| Dissolution rate (Å/min) | 5 | 15 | 0 | 16 |
| State of surface | ○ | x | ○ | x |

Note Corrosion inhibitor
*1: Thioglycerol; $SHCH_2CH(OH)CH_2(OH)$
*2: 2-Mercaptoethanol; $SHCH_2CH_2(OH)$
*3: Glycerol; $OHCH_2CH(OH)CH_2(OH)$
*4: Thioglycolic acid; $SHCH_2COOH$
*5: Benzotriazol; $C_6H_5N_3$
*6: 3-Mercapto-1-propanol; $SHCH_2CH_2CH_2(OH)$
Cleaning liquid
*7: 0.1% by weight hydrofluoric acid
*8: 1% by weight hydrochloric acid
State of surface
○: No change
x: Surface roughed

What is claimed is:

1. A cleaning liquid comprising 2-mercaptoethanol or thioglycerol, and a solution of an alkaline compound selected from the group consisting of sodium hydroxide, potassium hydroxide, ammonium hydroxide, tetramethylammonium hydroxide and choline.

2. A process for cleaning semiconductor devices, which comprises contacting the devices with the cleaning liquid according to claim 1.

3. A process for cleaning semiconductor devices provided with copper wiring, which comprises contacting the devices with the cleaning liquid according to claim 1.

4. A cleaning liquid comprising 2-mercaptoethanol or thioglycerol, and a solution of an acid compound.

5. A cleaning liquid according to claim 4, wherein the acid compound is selected from the group consisting of hydrochloric acid, hydrofluoric acid, sulfuric acid, nitric acid, oxalic acid, citric acid, malonic acid, malic acid, fumaric acid and maleic acid.

6. A process for cleaning semiconductor devices, which comprises contacting the devices with the cleaning liquid according to claim 4.

7. A process for cleaning semiconductor devices provided with copper wiring, which comprises contacting the devices with the cleaning liquid according to claim 4.

8. A cleaning liquid comprising 2-mercaptoethanol or thioglycerol, and a solution of an acid compound, which is an organic carboxylic acid or an inorganic acid.

* * * * *